(12) United States Patent
Basol et al.

(10) Patent No.: US 7,585,547 B2
(45) Date of Patent: Sep. 8, 2009

(54) METHOD AND APPARATUS TO FORM THIN LAYERS OF MATERIALS ON A BASE

(75) Inventors: Bulent M. Basol, Manhattan Beach, CA (US); Serkan Erdemli, San Jose, CA (US)

(73) Assignee: SoloPower, Inc., San Jose, CA (US)

( * ) Notice: Subject to any disclaimer, the term of this patent is extended or adjusted under 35 U.S.C. 154(b) by 29 days.

(21) Appl. No.: 11/735,430

(22) Filed: Apr. 13, 2007

(65) Prior Publication Data

US 2007/0243657 A1 Oct. 18, 2007

Related U.S. Application Data

(60) Provisional application No. 60/744,827, filed on Apr. 13, 2006.

(51) Int. Cl.
*C23C 16/00* (2006.01)
*B05D 1/40* (2006.01)
*B05D 3/10* (2006.01)
*B05D 3/04* (2006.01)
*B05D 3/12* (2006.01)
*B05D 3/02* (2006.01)

(52) U.S. Cl. ............... 427/248.1; 427/331; 427/333; 427/341; 427/350; 427/372.2; 427/383.1

(58) Field of Classification Search .......... None
See application file for complete search history.

(56) References Cited

U.S. PATENT DOCUMENTS

| 4,798,660 | A | | 1/1989 | Ermer et al. |
| 4,915,745 | A | * | 4/1990 | Pollock et al. ............... 136/265 |
| 5,410,796 | A | | 5/1995 | Weeks, Jr. |
| 5,476,811 | A | * | 12/1995 | Fujii et al. ..................... 438/37 |
| 5,997,956 | A | | 12/1999 | Hunt et al. |
| 6,048,442 | A | | 4/2000 | Kushiya et al. |
| 6,092,669 | A | | 7/2000 | Kushiya et al. |
| 6,537,845 | B1 | * | 3/2003 | McCandless et al. .......... 438/93 |
| 6,547,876 | B2 | * | 4/2003 | Ferguson et al. ............... 117/88 |
| 6,923,625 | B2 | | 8/2005 | Sparks et al. |
| 2001/0006734 | A1 | | 7/2001 | Demiryont |

OTHER PUBLICATIONS

Malinowska et al. Cadmium Recovery and Recycling from Chemical Bath Deposition of CdS Thin Layers, Progress in Photovoltaics: Research and applications, 2002, 10: pp. 215-228.*

(Continued)

*Primary Examiner*—Timothy Meeks
*Assistant Examiner*—Kelly M Gambetta
(74) *Attorney, Agent, or Firm*—Pillsbury Winthrop Shaw Pittman LLP (57) ABSTRACT

The present invention relates to method and apparatus for preparing thin films of materials for various applications including electronic devices such as solar cells. In one aspect, each of the method and apparatus passing an electrical current through at least one of the base or sheet to provide controlled localized heat to the base or sheet, or to layers disposed above the base or sheet. In another aspect, the controlled localized heat is provided in combination with a process environment that can be a non-inert gas that contains an element that will become part of a compound on the base or sheet, or an inert gas that allows for the process environment to provide annealing.

13 Claims, 5 Drawing Sheets

OTHER PUBLICATIONS

Voss C., et al. "Growth kinetics of thin-film cadmium sulfide by ammonia-thiourea based CBD" J. of the Electrochemical Society, 151 (10); pp. C655-C660 (2204.

International Search Report issued Aug. 13, 2008 in PCT/US2007/66672.

* cited by examiner

METHOD AND APPARATUS TO FORM THIN LAYERS OF MATERIALS ON A BASE

PRIORITY CLAIM

This application claims priority to U.S. Provisional Patent Application No. 60/744,827 filed Apr. 13, 2006 entitled "Method and Apparatus to Form Thin Layers of Materials on a Conductive Surface."

FIELD OF THE INVENTION

The present invention relates to method and apparatus for preparing thin films of materials for various applications including electronic devices such as solar cells.

BACKGROUND

Thin films of materials are used for many applications. In some of these applications the films or layers deposited on substrates are not electrically active. For example, hard ceramic coatings such as carbides, nitrides and oxides of various elements are used to provide wear resistance to the substrate that they are deposited on. Some coatings provide color. Some others, such as tribological coatings, reduce the friction coefficient on the surface of the substrate that they are deposited on. In applications where the thin film is electrically active, the electrical activity varies depending on the nature of the layer. For example, metallic layers such as Al, Cu, Ni etc. may act as conductors. Semiconducting layers, on the other hand may be used in thin film device fabrication such as thin film transistors, solar cells, photoconductors, detectors etc.

Thin films may be deposited on substrates by a large variety of techniques, including vacuum evaporation, sputtering, chemical vapor deposition, electrodeposition, electroless plating, ink deposition, melt deposition, dipping, spinning etc. The mechanical, structural and/or electrical properties of the deposited films generally vary with deposition conditions including the temperature of the substrate during the film deposition step. Therefore, the substrate temperature needs to be closely controlled during the deposition of the films.

In some compound layer growth techniques the film deposition involves more than one step. As will be described further below, in two-stage or multi-stage processes, certain elements of the desired compound may first be deposited on a substrate in the form of a precursor layer and then reacted to form the desired compound film. In these cases, the substrate temperature need to be closely controlled, especially during the reaction step because the properties of the resulting compound layer depend, to a large extent, to details of the reaction process.

In processes involving heating the substrate during film deposition, various designs of substrate heaters are employed. Typically the substrate to be coated with the film is placed on or brought to proximity of a substrate heater, which may be, for example a lamp heater or a resistive heater. In applications where deposited layers are reacted to form compounds, reactions may be carried out in ovens, furnaces, rapid thermal process tools etc, where various different temperature control means are utilized. In certain applications, however, very fast response times are required for heating and/or cooling the substrates on which the films are grown. Additionally, it is always attractive to apply the heat mostly to the substrate but not to the environment the substrate is placed in.

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$ (where $0 \leq x \leq 1$, $0 \leq y \leq 1$ and k is approximately 2) have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

One technique for growing $Cu(In,Ga)(S,Se)_2$ type compound thin films for solar cell applications is a two-stage process where at least two components of the $Cu(In,Ga)(S,Se)_2$ material are first deposited onto a substrate, and then reacted with each other and/or with a reactive atmosphere in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer allows the growth of a $Cu(In,Ga)(S,Se)_2$ absorber.

There are many other versions of the two-stage process that have been employed by different research groups. For example, stacked layers of sputter deposited (Cu—Ga)/In, and co-evaporated (In—Ga—Se)/(Cu—Se), and (In—Ga—Se)/Cu stacks have all been used as precursor materials which were reacted at high temperatures with S and/or Se to form the final absorber film. Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on substrates and then the stacked film was heated in the presence of gas containing Se at elevated temperature, as described in U.S. Pat. No. 4,798,660. More recently U.S. Pat. No. 6,048,442 disclosed a method comprising sputter-depositing a stacked precursor film comprising a copper-gallium alloy layer and an indium layer on a metallic back electrode layer or a contact layer and then reacting this precursor film with one of selenium and sulfur to form the absorber layer. U.S. Pat. No. 6,092,669 described sputtering-based equipment for producing such absorber layers. Electrodeposition may also be used to deposit the metallic precursors, such as Cu and In layers, on a substrate.

Irrespective of the technique used for the deposition of the precursor layers comprising at least one Group IB material and at least one Group IIIA material, the precursor layer need to go through a reaction step to form the Group IBIIIAVIA compound layer. This is achieved heating the substrate on which the precursor is deposited and exposing it to at least one Group VIA material. This reaction step may be carried out in batch furnaces where a large number of substrates are heated up slowly to elevated substrates of 400-550 C in the presence of Se and/or S. This batch process is typically carried out for 20-60 minutes. One other approach utilizes a rapid thermal process where, typically, precursors comprising Group IB, Group IIIA and Group VIA materials are heated up rapidly to initiate and carry out reaction between them forming the Group IBIIIAVIA compound layer. It is reported that ramp rates in such a process is very important and that temperature rise rates of about 10 C/sec is needed to avoid defects in the forming compound layer.

Figure 1:
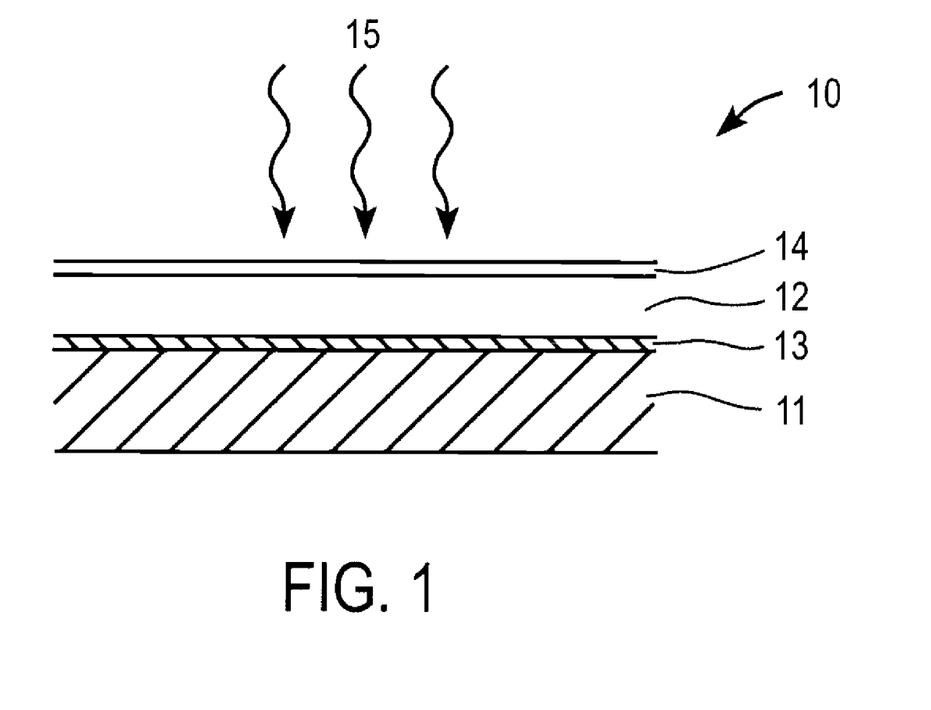
FIG. 1 is a cross-sectional view of a solar cell employing a Group IBIIIAVIA absorber layer.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as of a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the ohmic contact to the device. Various conductive layers comprising Mo, Ta, W, Ti, stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the superstrate side.

In any process involving heating a substrate on which a thin film material such as a thin film semiconductor is being formed, heating uniformity, heating rate and sometimes cooling rate are important parameters that influence the properties of the film that is formed on the substrate. There is, therefore, a need to develop novel approaches to closely control such parameters.

SUMMARY OF THE INVENTION

The present invention relates to method and apparatus for preparing thin films of materials for various applications including electronic devices such as solar cells.

In one aspect, each of the method and apparatus passing an electrical current through at least one of the base or sheet to provide controlled localized heat to the base or sheet, or to layers disposed above the base or sheet.

In another aspect, the controlled localized heat is provided in combination with a process environment that can be a non-inert gas that contains an element that will become part of a compound on the base or sheet, or an inert gas that allows for the process environment to provide annealing.

In a particular aspect, the present invention provides a method of forming a reacted film, the method includes providing a base; depositing on the base a precursor layer including two or more elements; and passing an electrical current through at least one of the base and the precursor layer to provide controlled localized heat to the precursor layer and cause a reaction of the two or more elements of the precursor layer to form the reacted film.

In another aspect the present invention provides an apparatus for forming a film on a sheet, the apparatus including a process chamber for exposing the sheet to a process environment that includes at least one constituent element; and an electrical circuit disposed with the process chamber that provides an electrical current to the sheet to cause controlled localized heat to the sheet.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

In one embodiment, a film is formed on a substrate comprising a conductive layer or portion. A current is passed through the conductive layer or portion to heat up the conductive layer or portion and therefore the film, which is thermally coupled to it. The substrate may itself be a conductor, in which case there may not be a need for an additional conductive layer or portion. The invention will now be described using an example of forming thin layers of Group IBIIIAVIA semiconducting compounds. Those skilled in the art would recognize that the invention may be used to form a large variety of semiconductor, conductor or insulating layers on various substrates.

Figure 2:
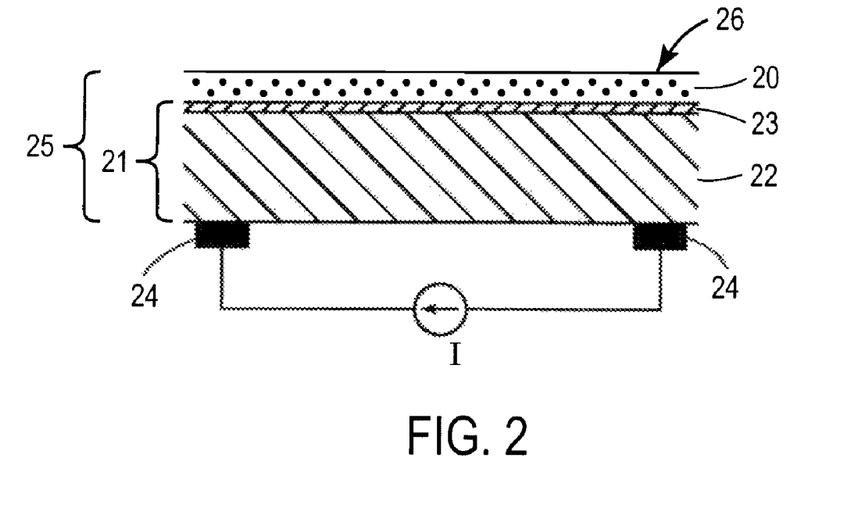
FIG. 2 shows a stack being heated by passing an electrical current through it.

FIG. 2 shows a stack 25 made of a precursor layer 20 deposited on a base 21. The precursor layer 20 of this example may comprise Cu, In, and Ga. It may additionally comprise a Group VIA material such as Se and/or S. These materials may be in the form of a mixture such as mixture of Cu, In, and Ga, or a mixture of Cu, In, Ga and Se, or they may be in the form of stacked sub-layer to form the precursor layer 20. Sub-layers may comprise Cu, In, Ga and Se and may be arranged in different orders to form the stacked precursor layers. Some examples of the stacked precursor structures include Cu/Ga/In, Cu/In/Ga, Cu/Ga/In/Se, CuIn/Ga/Se, Cu—Ga/In/Se, Cu—In/Ga/Se, Cu—Se/In—Se/Ga—Se, and Cu/Ga—Se/In—Se. The base 21 may comprise a substrate 22 and a contact layer 23. The substrate 22 may be a conductive sheet or foil such as a stainless steel foil, a Mo foil, a Ti foil, an Al foil etc. The contact layer may comprise any proper material that makes good ohmic contact to Group IBIIIAVIA compound layers. These materials include Mo, Ta, W, Hf, Ru etc. The stack 25 may be placed in an enclosure (not shown) and a current, "I", may be passed through it by touching the stack 25 with electrodes 24. It should be noted that in this example, all the components of the stack 25, i.e. the substrate 22, the contact layer 23 and the precursor layer 20, may be conductive. Therefore the current may pass through all these components. However, since the substrate 22 is typically much thicker (25-250 microns) than the rest of the layers in the stack 25, most of the current may pass through the substrate 22. The typical thickness ranges for the contact layer 23 and the precursor layer 20 are, 0.1-3 microns and 0.2-2 microns, respectively. A current of 1-1000 Amperes (A) or larger may be passed through the stack depending on the lateral resistance of the stack which, in turn, is determined by the thickness, the width and the length of the stack 25 or the substrate 22. When an electrical current "I" is passed thorough the stack 25 or the substrate 22, the temperature of the stack 25 rises and a reaction is initiated within the precursor layer 20 between Cu, In, Ga and Se. If there is no Se within the precursor layer 20, Se or another Group VIA material, such as S and/or Te may be provided to the top surface 26 so that a Group IBIIIAVIA compound layer is formed on the contact layer 23 as a result of this reaction.

Figure 2A:
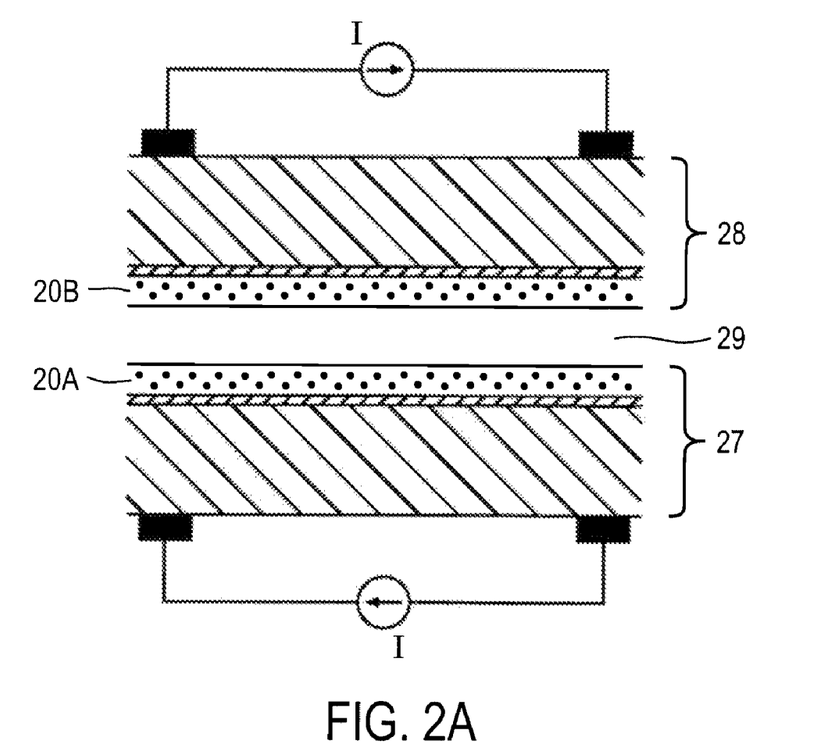
FIG. 2A shows face-to-face processing in accordance with one embodiment.

It should be noted that the present invention uses the stack and/or the base and/or the conductive substrate as a heater. Therefore, the temperature of the film forming over the substrate or the base may be controlled accurately with a fast response time. Temperature control may be achieved by attaching at least one thermocouple to the base (not shown). Temperature rise times of 10-100 C/sec may be readily obtained using this approach depending on the current density used to pass through the stack or the substrate. Such high temperature rise times are difficult to achieve in a uniform manner using standard Rapid Thermal Processing (RTP) approaches employing lamps or heater blocks. Another benefit of the present invention is increased throughput. In a regular RTP approach using heating lamps only one substrate is processed at a time. In FIG. 2, for example, a bank of lamps may be placed above the precursor layer 20 and these lamps may shine down onto the top surface 26 heating the precursor layer 20. Therefore, it is necessary to have the top surface 26 exposed to radiation from the lamps. In the present approach however, face-to-face processing may be carried out as shown in FIG. 2A, where a first stack 27 and a second stack 28 are placed across from each other forming a gap 29 between them. When current is passed through both stacks using two power supplies (as shown) or a single power supply (not shown), both of the stacks are heated up and the first precursor layer 20A as well as the second precursor layer 20B may be reacted at the same time. Such an arrangement doubles the throughput of the process and it forms a uniformly heated gap 29 through which inert or reactive gasses may be passed. For example, if the first precursor layer 20A and the second precursor layer 20B comprise Cu, In, Ga and Se, they both would be converted into $Cu(In,Ga)Se_2$ layers after the heating step which may take the temperature to a range of 200-550 C or higher. In this case an inert gas, vacuum and/or Se vapor may be present in the gap 29. Having a small gap of 1-5 mm also contains the volatile Se species within the gap and increases Se utilization by keeping Se close to the precursor surface during reaction. If the first precursor layer 20A and the second precursor layer 20B comprise Cu, In, and Ga but no Se, both precursor layers could be converted into $Cu(In,Ga)Se_2$ layers after the heating step if a Se containing gas such as $H_2Se$ or Se vapor is provided to the gap 29 so that the provided Se may react with the Cu, In and Ga species in the two precursor layers. Having a small gap of 1-5 mm contains the volatile Se species within the gap and increases Se utilization by keeping it close to the precursor surface during reaction.

Figure 3A:
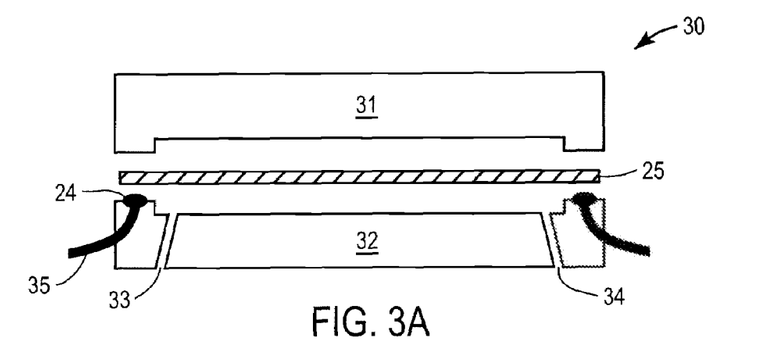
FIG. 3A shows a stack being placed in a reactor.
Figure 3B:
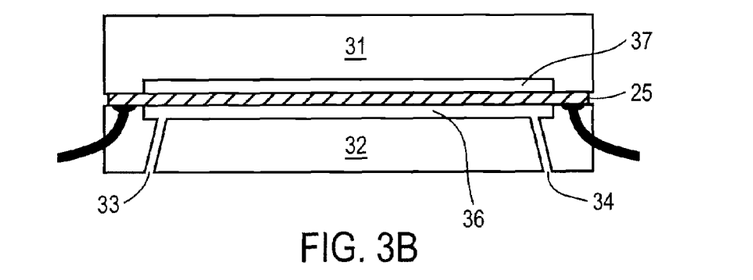
FIG. 3B shows the stack of FIG. 3A being heated up in accordance with one embodiment while the reactor is closed.

The technique of the present invention applies heat directly where it is needed, i.e. directly to the film that is being formed over the substrate. The invention may also be used in a way that allows control of the cooling rate. FIGS. 3A and 3B show an example of such a case.

FIG. 3A shows a reactor 30 comprising an upper block 31 and lower block 32. The stack 25, which may be similar to the stack 25 of FIG. 2, is placed between the upper block 31 and the lower block 32. Electrodes 24 with electrical leads 35 attached to terminals of a power source (not shown) are placed such that when the reactor 30 is closed by bringing the upper block 31 and the lower block 32 together (as shown in FIG. 3B), they make electrical contact with the stack 25. Once the electrical contact is established between the stack 25 and the electrodes 24, a current may be passed through the stack 25 via the electrodes 24, and the stack temperature may be raised to the desired level. In one embodiment, the lower block 32 may be chilled or it may be kept at a pre-selected temperature. There may be at least one gas inlet 33 and at least one gas outlet 34 provided in the lower block 32. As the stack 25 is heated by passing the electrical current through it, a gas such as nitrogen may be brought into the lower cavity 36 via the gas inlet 33 and taken out of the cavity via the gas outlet 34 as shown in FIG. 3B. After the film formation/reaction period the electrical current may be cut off and a thermally conductive gas such as He may be brought into the lower cavity 36 to thermally couple the stack 25 and the lower block 32, and rapidly cool the stack 25 down to the pre-selected temperature of the lower block 32. By changing the thermal conductivity of the gas (through changing the composition of the gas) in the lower cavity 36, and the depth of the lower cavity, one may control the rate of cooling down for the stack. It should be noted that, the lower cavity may be very shallow such as only 10-100 microns deep. Alternately, there may not be a lower cavity and the gas may just lift the stack away from the lower block 32 when passed during process. Also, if very rapid cooling is desired, vacuum may be pulled in the lower cavity to establish physical contact between the lower block 32 and the stack 25 once the heating/reaction step of the process is finished and the electrical current passing through the stack is cut off. There may be an upper cavity 37 formed between the upper block 31 and the stack 25. The upper block 31 may or may not be heated. There may also be gas inlets and outlets (not shown) bringing reaction gases or inert gasses to the upper cavity 37. For example, Se and/or S vapors or other gases containing Se and/or S may be brought into the upper cavity 37 at the time the stack is heated up by passing the current through it. Such gases may participate during reaction of the precursor layer to form the compound layer.

Various geometric versions of the reactors depicted in FIGS. 3A and 3B may be utilized. For example, these reactors may be turned 90 degrees or 180 degrees yielding vertical or horizontal designs. The substrate 22 may not be conductive but the contact layer 23 may be conductive. In this case the current may be passed through the contact layer 23 and the contact layer 23 may be used as a thin film heater. Also face-to-face processing may be carried out in the reactors as described in relation to FIG. 2A.

Figure 4:
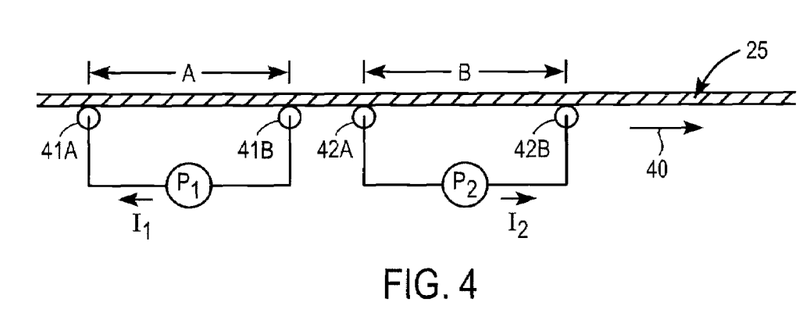
FIG. 4 shows two temperature zones formed on a substrate using four electrical contacts.

The present invention may also be used in a continuous, in-line process. For example, FIG. 4 schematically shows a section of a stack 25 being moved from left to right in the direction of arrow 40. A first set of electrical contacts 41A and 41B, which may be sliding contacts, rollers or brushes, are provided making electrical connection to the stack 25 defining a first zone A. A second set of electrical contacts 42A and 42B are provided making electrical connection to the stack 25 defining a second zone B. Power supplies P1 and P2 may be connected to the two sets of electrical contacts as shown in the figure. Depending upon how much power is applied by the power supplies P1 and P2, the temperature of the zones A and B may be pre-set or varied. For example, a first current $I_1$ may be passed through the zone A via electrical contacts 41A and 41B, and a second current $I_2$ may be passed through the zone B via electrical contacts 42A and 42B. If $I_1 < I_2$, the temperature in zone B of the stack would be higher than the temperature in zone A of the stack. For example, the current in zone A may be adjusted so that the temperature in this zone goes to 200 C, whereas the current in zone B may be selected so that the temperature goes up to 500 C. This way, as the stack 25 is moved in the direction of arrow 40 with respect to the electrical contacts (alternately the contacts may also be moved) the precursor layer of the stack may be put through a first temperature in zone A and then a second temperature in zone B. By using even more contact sets and zones, any temperature profile, from uniform to highly varying, may be obtained to carry out the reaction of the precursor layer.

The present invention is especially suited in applications where heat needs to be applied just to the substrate or stack without dispersing it extensively to the environment of a reactor. This way desired reactions may be initiated right on the substrate or stack surface rather than on reactor walls etc. In this case the conductive substrate or the stack is immersed into a reactor environment in a way to expose a face of the stack or the substrate to the reactor environment. The reactor environment may contain various chemicals, gasses, vacuum etc. that may be needed for the formation of the film on the substrate. Heat according to the present invention can be applied solely through the usage of passing the electrical current to heat the precursor layer, or a combination of using electrical current to heat the precursor layer and another heating step, either simultaneous with or after using the electrical current. If the heat generated using the electrical current causes a temperature range of 200-400 C within the precursor, there will likely be the need for a further step of heating. If, however, the electrical current heats the precursor layer to a temperature range of 400-600 C, then, depending on the length of time of the heating, another heating means or another heating step may not be, and preferably is not, needed.

An example will now be given where a wet deposition process is used to form a thin layer of CdS on a Group IBIIIAVIA compound layer.

In prior art techniques, fabrication of a Group IBIIIAVIA solar cells such as a $Cu(In,Ga)Se_2$ solar cell involves deposition of a thin CdS layer over the $Cu(In,Ga)Se_2$ absorber. One method of depositing the CdS layer is the chemical dip method where the $Cu(In,Ga)Se_2$ surface is dipped in a chemical solution comprising Cd (from salts such as Cd-nitrate, Cd-sulfate, Cd-chloride etc.) and S (from sources such as thiourea), complexing agents (such as ammonia). The solution is typically heated to 80-90 C to initiate the reaction between the Cd and S species in the solution. After exposing the $Cu(In,Ga)Se_2$ surface to the heated solution for a period of time, such as 5-30 minutes, a thin CdS layer forms on the $Cu(In,Ga)Se_2$ surface. Details of such a process may be found in the literature (see for example, C. Voss et al., Journal of Electrochemical Society, vol:151, p: C655, 2004). One drawback of this approach is the fact that Cd and S reaction and CdS formation happens everywhere in the system, including in the bulk of the solution and on the walls of the reactor or vessel that holds the solution. This is quite wasteful.

Figure 5:
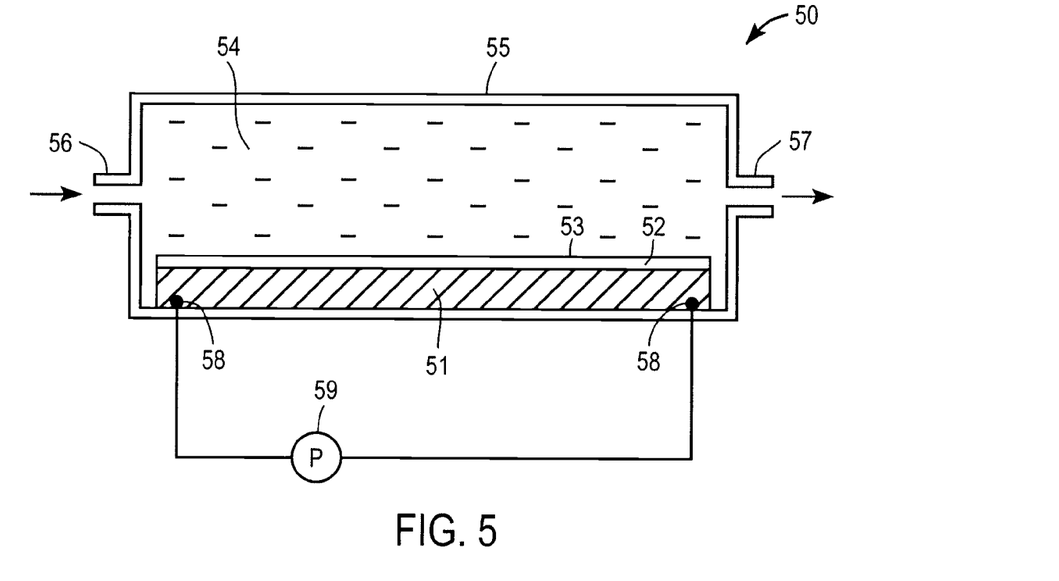
FIG. 5 shows a film being deposited on a layer out of a solution by selectively heating the layer.

FIG. 5 shows an exemplary system 50 employing the teachings of the present invention. The system 50 comprises a container 55 containing a solution 54. The solution may comprise Cd and S species as mentioned before. The container 55 may have an inlet port 56 and an outlet port 57 through which the solution 54 may be fed into and drawn out of the container 55. A conductive substrate 51 coated with a layer 52 such as a $Cu(In—Ga)Se_2$ layer is placed in the container 55 such that a surface 53 of the layer 52 is exposed to the solution 54. Electrical contacts 58 are provided and connected to a power supply 59. The temperature of the solution may be kept at a range of 10-60 C that does not allow much reaction between the Cd and S species. A current may then be passed through the electrical contacts 58 and the conductive substrate 51, heating the conductive substrate 51 and the layer 52 to a pre-selected temperature, such as to 60-90 C. A micro-layer of the solution 54 which is in contact with the surface 53 of the layer 52 gets heated and the Cd and S reaction is initiated within that micro-layer and on the surface 53, selectively forming a CdS layer on the surface 53, without wasting the bulk of the solution which may be pumped out through the outlet port 57, filtered and fed back into the container 55 through the inlet port 56.

It should be noted that the invention is applicable to cases where the container 55 may contain a gas rather than a liquid. For example, the layer 52 on the conductive substrate 51 may be a precursor layer comprising Cu, In and Ga and the container 55 may contain a gas comprising Se, such as $H_2Se$ gas or Se vapor. When the substrate 51 and the precursor layer is heated by passing current through the substrate 51, a reaction is initiated between the precursor layer and the gas forming a $Cu(In,Ga)Se_2$ compound film on the substrate 51. It should also be noted that the substrate 51 may be flat, coiled or it may be a roll of metallic foil immersed in a gas comprising Se. When current is passed through the whole roll, the whole roll may be heated instantly and uniformly initiating reaction uniformly. If a whole roll of metallic foil substrate, such as stainless steel foil, with a precursor layer deposited on it was placed into a furnace filled with a reactive gas such as a gas comprising Se, heating rate of the roll would be very non-uniform, the outside of the roll heating up first, while the core staying cooler. This would mean reaction with the reactive gas would be very non-uniform. If the whole roll is heated up by passing current through it, i.e. using the substrate roll as the heater, heating uniformity would be much better and this way large area production may be achieved without compromising the quality of the film that is formed on the substrate.

Figure 6:
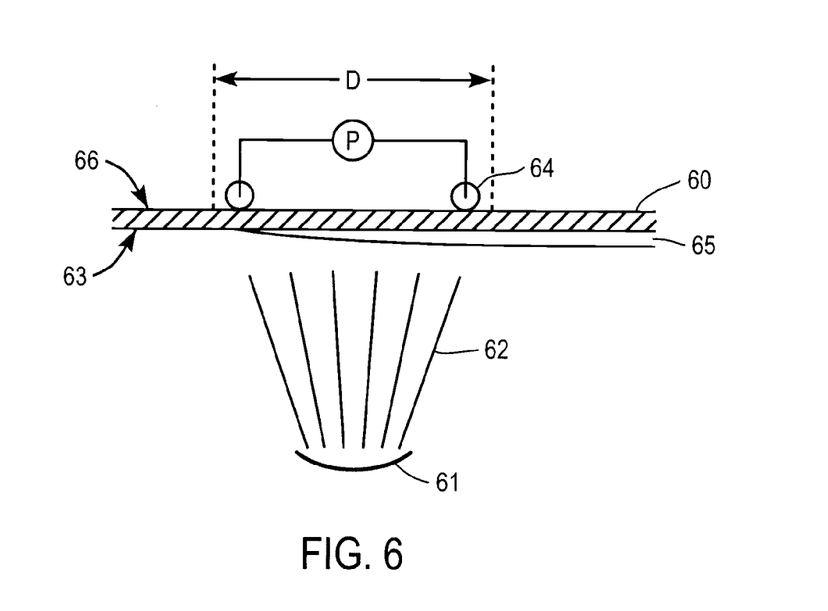
FIG. 6 shows a method of heating a substrate as a film is formed on a substrate.

So far we have described the invention in terms of forming a layer on a substrate through reaction of precursors or reaction from liquid phase. The invention may also be used for other deposition or film formation methods such as evaporation, sputtering, spray pyrolysis etc. For example, FIG. 6 shows a conductive substrate 60 being coated with a film 65 on its front surface 63. The substrate 60 may be moving from left to right in a continuous or step-wise fashion. Electrical contacts touching the back surface 66 of the substrate complete the electrical circuit with a power supply, P, and define a zone, D. As the substrate 60 moves from left to right, the section of the substrate within the zone D gets heated to a temperature of, for example, 50-600 C if the power supply is energized. A material flux 62 may be created by a source 61 and directed to the front surface 63 within the zone D. The source 61 may be a sputtering target, an evaporation source, a spray gun, a doctor blade, gravure printer, ink printing head etc., depending on the deposition approach selected. Material deposits and/or reacts and/or dries on the front surface 63 forming the film 65. It should be noted that the example above used a conductive substrate. However, the substrate may not be totally conductive but it may have a conductive portion or a conductive layer through which an electrical current may be passed to heat up the front surface 63. The conductive substrate of the present invention may be a metallic foil such as an Al foil or a stainless steel foil and the film 65 may be a precursor layer comprising at least one of a Group IB material, a Group IIIA material and a Group VIA material, or it may be a Group IBIIIAVIA compound absorber layer that is deposited on the conductive substrate for the purpose of fabricating thin film solar cells.

Figure 7:
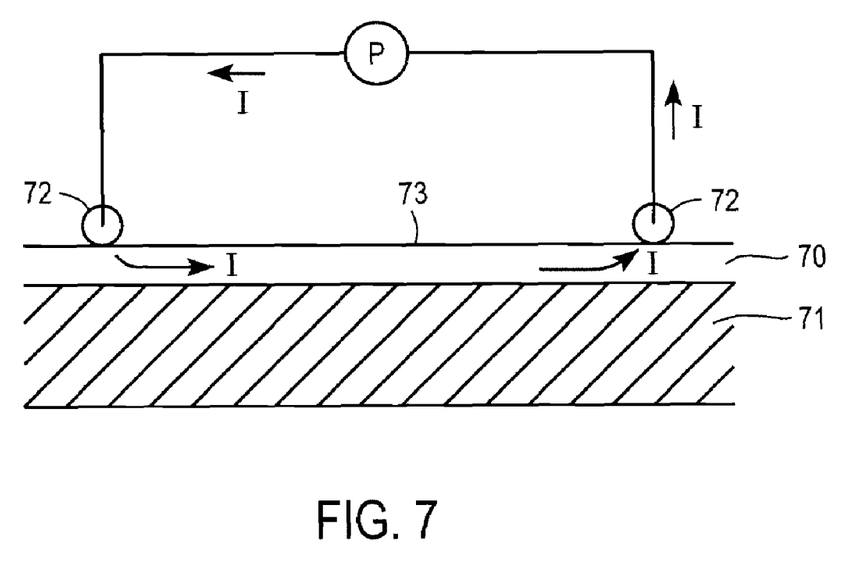
FIG. 7 shows a method of heating a conductive precursor layer to form a compound layer.

The present invention may also be used in a mode where the current passes primarily through the film being formed. For example, a conductive precursor layer comprising elements A, B and C may be used to form a A-B-C compound or a A-B-C-D compound as will be described. FIG. 7 shows a substrate 71 with a precursor film 70 on its surface. Precursor 70 is conductive and may comprise elements of A, B and C (such as Cu, In and Ga). The substrate 71 in this case may be insulating or may have high resistivity. There may be other layers such as contact layers etc between the substrate 71 and the precursor film 70 that are not shown for brevity. Contacts 72 electrically couple a power supply, P, to the precursor layer 70 and a current, I, passes through the precursor layer 70. Passing current heats the precursor and a reaction takes place within the precursor layer. For example Se may be provided to the top surface 73 of the precursor layer and thus a Cu(In,Ga)Se$_2$ compound layer may be formed through reaction of Cu, In and Ga within the precursor and Se that is provided from outside. It is of course possible that the precursor comprises all the elements required for compound formation. For example, the precursor may comprise elements of A, B, C and D (such as Cu, In, Ga and Se) in the form of a mixture or in the form of thin layers. Through heating all the elements may be reacted to form the A-B-C-D compound (such as a Cu(In,Ga)Se$_2$ compound). As the compound layer forms, its conductivity gets reduced and this may be used as a self-limiting control if power supply provides a constant voltage. It should be understood that under constant voltage conditions, as a compound layer is formed from a conductive precursor layer, the resistivity may increase and therefore the current passing through the forming compound layer gets reduced, in turn reducing heating of the compound layer upon completion of the reaction.

All embodiments above have been described using substrates or stacks that are in the form of flat plates or foils. It should be clear to those experienced in the art that the present invention may be used for various forms and shapes of substrates. For example, Group IBIIIAVIA compound layers may be formed on spherical conductors or conductive wires which may be cylindrical in shape. This way, thin film solar cells may be obtained on cylindrical substrates or wires. During the formation of the Group IBIIIAVIA layers on cylindrical wires the heat may be provided by passing current through the wires in accordance with various embodiments discussed so far. The wires may be wires of stainless steel, Mo, Ti, Al etc. They may be coated with a contact layer such as Mo, W, Ta, Ru etc. A precursor layer comprising at least one of Group IB material, a Group IIIA material and optionally a Group VIA material may be deposited on the contact layer by various methods such as sputtering, evaporation, electrodeposition etc. Electrodeposition is especially attractive because of high material utilization. Precursors comprising Cu, In and Ga may be electrodeposited, for example, on contact layers at high efficiency. Once formed, the precursor layers are reacted in presence of Group VIA materials to form Group IBIIIAVIA layers such as Cu(In,Ga)Se$_2$ layers on the wires.

Once the Group IBIIIAVIA compound layers are formed on substrates of various shapes and forms through using various embodiments of the present invention, solar cells may be fabricated on the compound layers of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

What is claimed is:

1. A method of forming a Group IBIIIA VIA material, the method comprising;

providing a first and a second base;

depositing on the first and second base a first and a second precursor layers, respectively, each of the precursor layers including a Group IB material and at least one of a Group IIIA material and a Group VIA material;

orienting the first and second precursor layers to face each other to form a space therebetween;

introducing at least one element into a process environment in the space between the first and the second precursor layers; and in the process environment, passing an electrical current through at least one of the first base and the first precursor layer and at least one of the second base and the second precursor layer to provide controlled localized heat to the first and second precursor layers and causing a reaction of the Group IB material with the at least one of the Group IIIA material and the Group VIA material of the first and second precursor layers to form the Group IBIIIAVIA material on the first and second base, respectively.

2. The method according to claim 1 wherein the first base and the second base each includes a conductive contact layer deposited on a first and a second substrate and each of the first and second precursor layers is deposited on the contact layer.

3. The method according to claim 2 wherein the first and the second substrates are flexible and conductive.

4. The method according to claim 3 wherein the first and the second precursor layers each comprises Cu, In, Ga and the at least one element introduced into the process environment in the space between the first and the second precursor layers is at least of Se and S.

5. The method according to claim 4 wherein the step of passing the electrical current heats the first and the second precursor layers to a temperature range of 200-600° C.

6. The method according to claim 5 wherein the step of passing the electrical current heats the first and the second precursor layers to the temperature range at a predetermined rate in the range of 10-100° C./second.

7. The method according to claim 3 wherein the first and the second precursor layers each include Cu, In, Ga and at least one of the first and the second precursor layers further includes at least one of Se and S, and the at least one element is an insert gas.

8. The method according to claim 3 wherein the first and the second precursor layers include Cu, In, Ga and at least one of Se and S.

9. The method according to claim 8 wherein the step of passing the electrical current heats the first and the second precursor layers to a temperature range of 200-600° C.

10. The method according to claim 9 wherein the step of passing the electrical current heats the first and the second precursor layers to the temperature range at a predetermined rate in the range of 10-100° C./second.

11. The method according to claim 3 wherein the first and the second precursor layers each include Cu, In, Ga and at least one of Se and S, and the at least one element is an inert gas.

12. The method according to claim 11 wherein the step of passing the electrical current heats the first and the second precursor layers to a temperature range of 200-600° C.

13. The method according to claim 12 wherein the step of passing the electrical current heats the first and the second precursor layers to the temperature range at a predetermined rate in the range of 10-100° C./second.

* * * * *